(12) United States Patent
Ossart et al.

(10) Patent No.: US 8,149,002 B2
(45) Date of Patent: Apr. 3, 2012

(54) DEVICE AND METHOD FOR CAPACITIVE MEASUREMENT BY A FLOATING BRIDGE

(75) Inventors: Frédéric Ossart, Nîmes (FR); Didier Roziere, Nîmes (FR)

(73) Assignee: Nanotec Solution, Nimes (FR)

( * ) Notice: Subject to any disclaimer, the term of this patent is extended or adjusted under 35 U.S.C. 154(b) by 984 days.

(21) Appl. No.: 12/093,582

(22) PCT Filed: Nov. 22, 2006

(86) PCT No.: PCT/FR2006/002566
§ 371 (c)(1),
(2), (4) Date: May 13, 2008

(87) PCT Pub. No.: WO2007/060324
PCT Pub. Date: May 31, 2007

(65) Prior Publication Data
US 2008/0231292 A1 Sep. 25, 2008

(30) Foreign Application Priority Data
Nov. 24, 2005 (FR) ..................................... 05 11916

(51) Int. Cl.
*G01R 27/26* (2006.01)
(52) U.S. Cl. .......................... 324/688; 324/662; 324/663
(58) Field of Classification Search .................. 324/662, 324/663, 688
See application file for complete search history.

(56) References Cited

U.S. PATENT DOCUMENTS

| | | | |
|---|---|---|---|
| 6,509,746 B1 * | 1/2003 | Wang | 324/678 |
| 7,570,064 B2 * | 8/2009 | Roziere | 324/662 |
| 2005/0134292 A1 * | 6/2005 | Knoedgen | 324/658 |
| 2006/0097733 A1 | 5/2006 | Roziere | |
| 2006/0097734 A1 | 5/2006 | Roziere | |

FOREIGN PATENT DOCUMENTS
FR 2 756 048 5/1998

OTHER PUBLICATIONS

Analog Devices Inc., 24-Bit Capacitance-to-Digital Converter with Temperature Sensor AD7745/AD7746; Analog Device Inc.; Apr. 2005; XP002388296; p. 21; figure 29.

* cited by examiner

*Primary Examiner* — Amy He
(74) *Attorney, Agent, or Firm* — Greer, Burns & Crain, Ltd.

(57) ABSTRACT

A device for capacitive measurement by a floating bridge, including: a sensor module including at least one measuring electrode and at least one guard electrode arranged close to a target connected to a general earth, at least one integrated circuit for capacitive measurement, provided with a guard to which the guard electrode is connected, having an input connected to the measuring electrode, a guard connected to the reference earth of the integrated circuit, an excitation output connected to the general earth, a measurement output, and structure for supplying the integrated circuit for capacitive measurement in floating mode.

35 Claims, 4 Drawing Sheets

DEVICE AND METHOD FOR CAPACITIVE MEASUREMENT BY A FLOATING BRIDGE

TECHNICAL FIELD

The present invention relates to a device for capacitive measurement by a floating bridge. It also relates to a method of capacitive measurement by a floating bridge, implemented in this device.

The field of the invention is that of the measurement of displacement, that of the measurement of distance and that of dimensional metrology, and more generally instrumentation equipment implementing capacitive measurements.

STATE OF THE ART

In capacitive metrology, the capacitances to be measured have in general very low values, and in order to obtain accurate measurements, it is necessary to minimize the parasitic capacitances associated with the connection between the sensor and the electronic unit and at the input stage of this electronic unit.

Document FR9613992 describes a method which suppresses these parasitic capacitances by using an electronic unit supplied by a floating direct-current voltage source with high resistive and capacitive electrical isolation with respect to earth, the assembly being surrounded by a guard taken to the voltage of the sensor guard. This electronic unit uses a charge amplifier as an input stage, a sinusoidal or square excitation, a synchronous demodulator and a modulator, in order to carry out a measurement of capacitance or a measurement of reverse capacitance.

Since then, integrated circuit manufacturers have made enormous progress in analog performance and miniaturization. Thus manufacturers such as the company Analog Device offer electronic chips having a complete capacitive measurement function.

Certain of these circuits generate a pseudo-guard to limit the leakage capacitances, but do not eliminate them sufficiently to enable their use in the field of precision dimensional metrology. In fact the currently used technologies for producing these integrated circuits do not make it possible to produce a guard compatible with the requirements for capacitive metrology.

The aim of the invention is to propose a new device for capacitive measurement by floating bridge, making it possible to ally the performances of a very high-precision floating capacitive assembly and the low production cost resulting from the use of integrated capacitive measurement circuits offered for low- or medium-precision applications.

SUMMARY OF THE INVENTION

This aim is achieved with a device for capacitive measurement by floating bridge, comprising:
- a sensor module comprising a measuring electrode and a guard electrode arranged close to a target electrode connected to a general earth,
- an integrated circuit for capacitive measurement, equipped with a guard to which said guard electrode is connected, having an input connected to said measuring electrode, an earth reference connected to said guard, an excitation output connected to the general earth, and a measurement output, and
- means for supplying said integrated circuit for capacitive measurement in floating mode.

The means for floating supply are preferably arranged to achieve galvanic isolation of the integrated circuit for capacitive measurement with respect to a voltage source external to the guard.

The device for capacitive measurement according to the invention can also advantageously comprise means of differential amplification for generating, from the output signal of the integrated circuit for capacitive measurement, an output signal in reference to the general earth.

It can also comprise amplification means, arranged between the excitation output of the integrated circuit for capacitive measurement and the general earth, as well as means for supplying the amplification means at a higher voltage than that of the integrated circuit for capacitive measurement.

In one configuration of a device according to the invention, also comprising a second concentric guard electrode surrounding the first guard electrode, the second concentric guard electrode is connected to the general earth.

In the case where the sensor module comprises a first measuring electrode and a second measuring electrode which are approximately parallel, and situated between them is a target electrode connected to the general earth, the first and second measuring electrodes are then connected respectively to a first input and a second input of the integrated circuit for capacitive measurement, and are surrounded respectively by a first guard electrode and a second guard electrode.

The first and second guard electrodes are generally connected to each other and to the guard by means of a common guard connection.

The first and second guard electrodes are for example connected to the guard via a first and a second guard connection respectively.

When the device for capacitive measurement according to the invention also comprises a plurality of measuring electrodes surrounded by a guard electrode connected to the guard, a first configuration can be envisaged in which the device also comprises switching means connected at input to the plurality of measuring electrodes and at output to the input of the integrated circuit for capacitive measurement, situated inside the guard and controlled by means for control and processing.

In a second configuration, the device for capacitive measurement according to the invention also comprises a plurality of integrated circuits for capacitive measurement, each connected at input to a measuring electrode, and at output, each having their oscillator output connected to the input of first switching means of which the output is connected to the general earth, and their measurement output connected to the input of second switching means generating at output a multiplexed capacitive measurement signal, said first and second switching means being situated inside the guard and controlled by means for control and processing.

The device for capacitive measurement according to the invention can also comprise optocoupling means arranged between the switching means and the means for control and processing.

The integrated circuit for capacitive measurement can advantageously comprise charge transfer capacitance/digital conversion (CDC) means, or also a Delta Sigma capacitance-digital converter.

The integrated circuit for capacitive measurement can either be situated close to the electrodes of the sensor module, or remote from the electrodes by means of a coaxial or triaxial cable. It can comprise differential inputs and have a single guard, and comprise floating supply means to supply the components arranged inside the guard, for example a direct current-direct current DC-DC or alternating current-direct current AC-DC conversion module.

This DC-DC conversion module can for example comprise a transformer comprising, as a primary circuit, a coil excited by an alternating signal referenced to a general earth, and as a secondary circuit, a receptor coil connected to rectifier means for generating a floating direct-current voltage. This transformer can be of the "planar" type.

The floating supply can also be implemented with choke coils separating the supply referenced to the general earth from the floating supply referenced to the guard. These choke coils can be tuned to the excitation frequency of the electrodes in order to increase the impedance of the choke coils.

In a miniaturized version, the device for capacitive measurement according to the invention is produced in the form of a printed circuit on which the measuring electrode is etched, said printed circuit receiving the integrated circuit for capacitive measurement, the means for floating supply, and means for connecting the integrated circuit to external equipments.

A device for capacitive measurement according to the invention can be used in an anti-collision system, a shape recognition system, in a dimensional metrology system, in a biosensor, in a system for characterization of materials.

It can also be used in a strain gauge, and thus be fixed to a reference support and have a measuring electrode targeting the surface of a part being subjected to a deformation to be measured.

According to another aspect of the invention, a method of capacitive measurement by floating bridge is proposed, implemented in a device according to the invention in which an integrated circuit for capacitive measurement, surrounded by a guard, comprises:
  an input connected to a measuring electrode which is surrounded by a guard electrode connected to said guard, and which is arranged close to a target electrode connected to a general earth
  an earth reference connected to said guard.
  an excitation output connected to said general earth, and
  a measurement output, this method comprising a supply in floating mode of said integrated circuit for capacitive measurement.

The present invention offers a solution for generating a quality guard of which the functionality is compatible with integrated circuits dedicated to capacitive measurement. An example of integrated circuit is the AD7745 and AD7746 from Analog Device. This circuit uses a high-resolution Delta Sigma capacitance/digital converter A second circuit derived from the AD7745 and AD7746 is the AD7747 equipped with a pseudo-guard but using a single supply voltage without floating voltage.

The first family has very good resolution and capacitive leakage performances, but it measures only capacitances in respect of which one of the two electrodes is connected to the input of the integrated circuit and the second is connected to an excitation signal generated by the chip. In these conditions the measured capacitance or the sensor is termed floating. This chip can carry out measurements of capacitances of which one of the two electrodes is connected to the electrical earth only if this circuit is supplied in floating fashion.

The second type of circuit with a pseudo guard makes it possible to measure capacitances where one of the two electrodes is connected to the input of the electronic chip and the second is connected to the electrical earth. The capacitive leakage and precision performances are lower than those obtained with the first family described in the previous paragraph, as the guard is generated by a non-floating excitation.

A non-limitative example of application is the use of a non-contact multi-electrodes sensor for measuring displacement or for detection of an object. This type of method described in the published patent application No. 0211089 "Proximity detector comprising capacitive sensor" uses a floating electronic unit equipped with a scanner termed multiplexer means placed between the electrodes and the input of the electronic unit. These multiplexers have parasitic capacitances which are superimposed on the capacitances to be measured if the electronic unit is termed non-floating with or without pseudo guard.

Under these conditions, the only way of using commercially available capacitive measurement chips connected to multi-electrodes sensors is to supply these chips by floating voltage.

Another advantage of this technique is the ability to place floating electronic circuits close to the electrodes of the sensor, to contribute new functions such as for example temperature measurement.

Another advantage is the suppression of the effect of parasitic capacitive and resistive loads connected to the chip via the sensor and the connection cable on measuring. In fact, the Analog Device integrated circuits described above have a poor rejection of the parasitic capacitance and resistive loads present between the input and the earth of the chip. Leakage currents generated by these loads are very substantially reduced, even eliminated, by the floating supply.

Another advantage is the ability to increase the excitation amplitude of the capacitance to be measured by adding an amplifier between the excitation output of the chip and the capacitance to be measured. This amplifier can be supplied at a higher voltage than that of the chip, using the floating supply. Increasing the amplitude of this excitation increases the resolution of the capacitive measurement accordingly.

The output signals of this type of chip representing the measurement are in general digital and can be analog. They can be transmitted via optocoupler circuits or differential amplifiers in order to retain the isolation of the floating circuit from the external circuits.

DESCRIPTION OF THE FIGURES AND EMBODIMENTS

Other advantages and characteristics of the invention will become apparent on examination of the detailed description of embodiments which are in no way limitative, and the following attached drawings.

In the following description, with reference to the above-mentioned figures, the components and modules common to a plurality of embodiments or versions of the device for capacitive measurement according to the invention have identical reference numbers.

Figure 1:
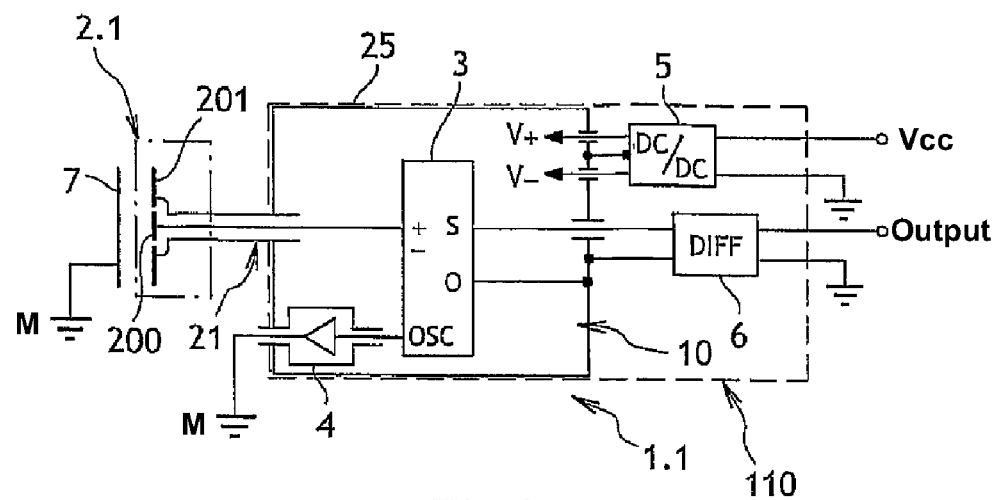
FIG. 1 illustrates a first embodiment of a device for capacitive measurement according to the invention, using a coaxial floating assembly.

Firstly, with reference to FIG. 1, a first embodiment of a device for capacitive measurement according to the invention, using a coaxial assembly, will be described.

This device for capacitive measurement 1.1 comprises an integrated circuit for capacitive measurement 3, comprising nominally a first input (±), a second input (−), an output OSC delivering an oscillator signal, a measurement output S and an earth terminal. The input (+) is connected to a central electrode 200 of a module 2.1 of measuring electrodes arranged close to a target electrode 7 and provided with a concentric guard electrode 201 connected to a guard 25 surrounding the integrated circuit for capacitive measurement 3 of which the output OSC is connected via a guarded amplifier 4 to the general earth M of the measuring device 1.1 to which the target electrode 7 is also connected.

The integrated circuit for capacitive measurement 3 and the oscillation amplifier 4, which are placed on a printed circuit 10, are supplied with direct-current voltage (V+, V−) by a direct current/direct current (DC/DC) or alternating current/direct current (AC/DC) converter 5 connected to the guard 25 and of which the input is connected to a voltage source Vcc. The measuring electrodes module 24-2.1 is connected to the printed circuit 10 by a coaxial cable 21. The output S of the integrated circuit for capacitive measurement 3 is connected to a first input of a differential amplifier 6 of which the second input is connected to the guard 25. This differential amplifier 6 delivers a capacitive measurement signal at its output. The circuits 3, 4 inside the guard 25, the DC/DC converter 5 and the differential amplifier are in practice situated on a printed circuit board 110. If the output signal S is of the digital type, not analogue, then the differential amplifier can be replaced by an optocoupler.

Figure 2:
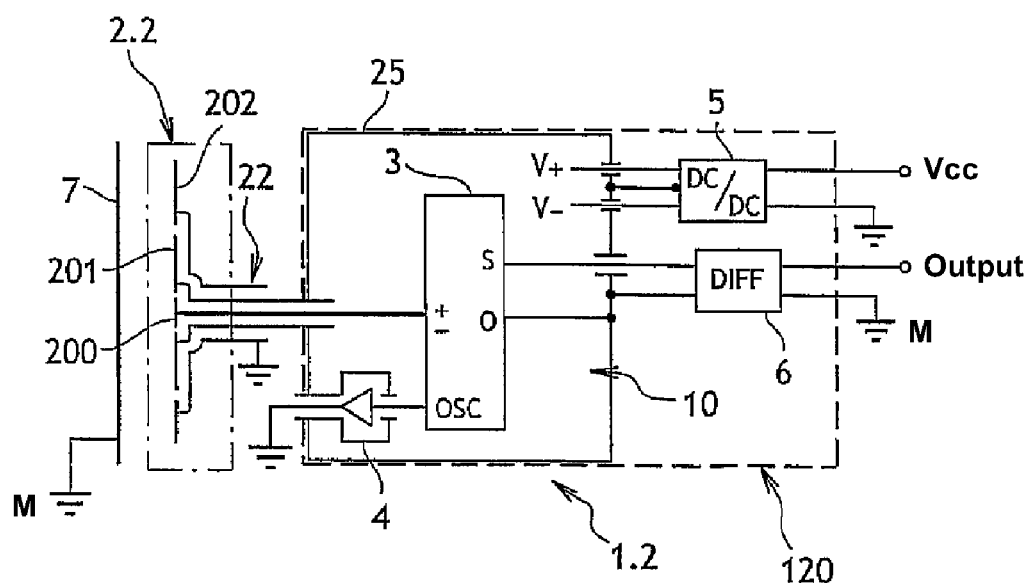
FIG. 2 illustrates a second embodiment of a device for capacitive measurement according to the invention, using a triaxial floating assembly.

In a second embodiment of a device 1.2 for capacitive measurement according to the invention, illustrated in FIG. 2, the arrangement of the electronic components is identical to that of the first example which has just been described, but its measuring electrodes module 2.2 is connected to the printed circuit 10 by a triaxial cable 22 and comprises, as well as the central electrode 200 connected to the (+) input of the integrated circuit 3, a first guard electrode 201 connected to the guard 25, and a second guard electrode 202 connected to the general earth of the device for capacitive measurement 1.2.

Figure 3:
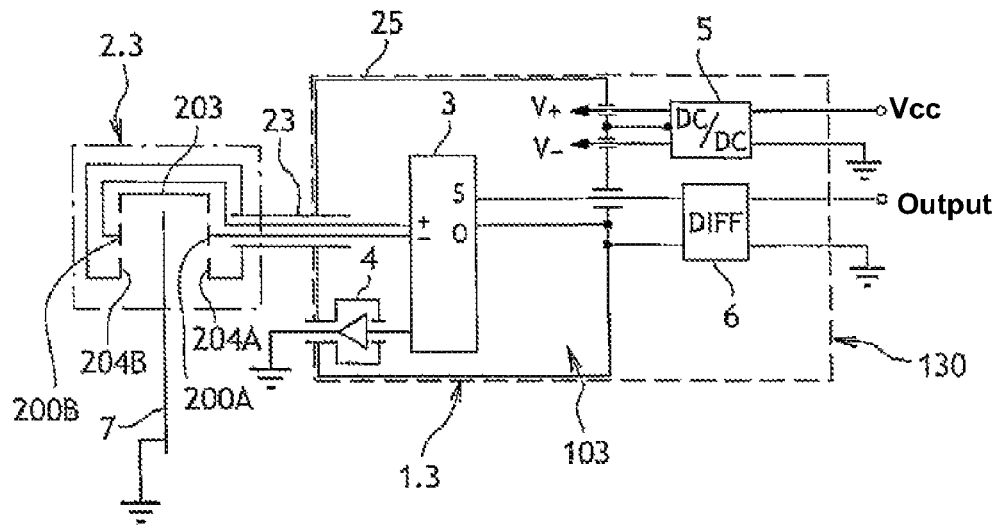
FIG. 3 illustrates a first version of a third embodiment of a device for capacitive measurement according to the invention, using a differential floating assembly.
Figure 4:
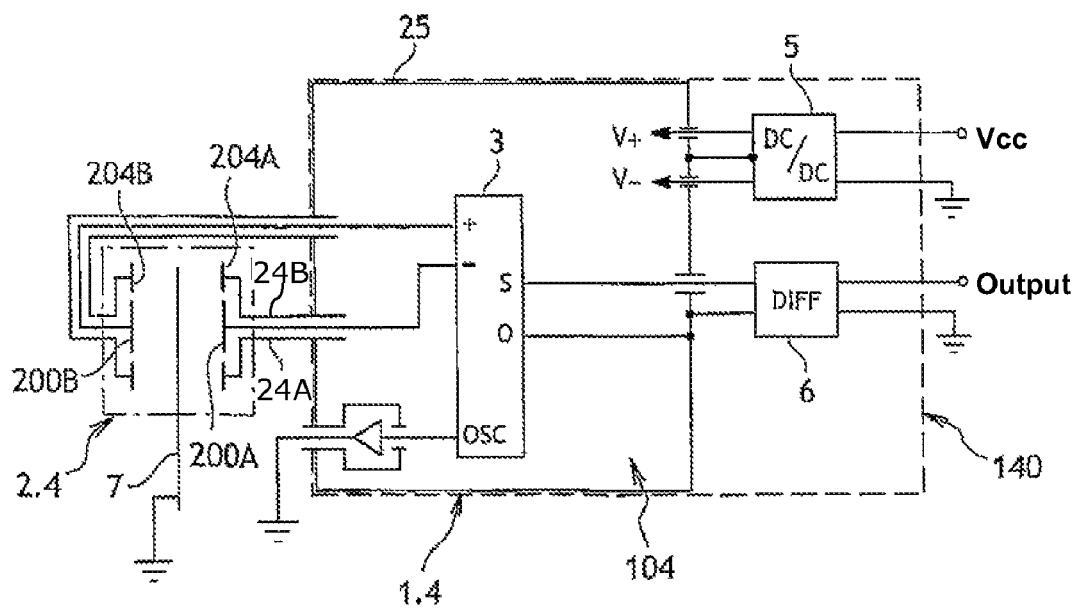
FIG. 4 illustrates a second version of the third embodiment of a device for capacitive measurement according to the invention.

In a third embodiment of a device for capacitive measurement according to the invention, illustrated in FIGS. 3 and 4, the electrodes module has a differential structure.

In a first version (FIG. 3) of this embodiment, the electrodes module 2.3 of the measurement device 1.3 comprises a first sub-assembly and a second sub-assembly of electrodes comprising respectively a first central electrode 200A and a second central electrode 200B arranged on either side of the electrode 7, and a first guard electrode 204A and a second guard electrode 204B, each surrounding a central electrode 200A, 200B. The guard electrodes 204A, 204B are connected via a cable 23 to the guard 25, while the first and second central electrodes 200A, 200B are connected respectively to the (+) and (−) inputs of the integrated circuit 3.

In a second version (FIG. 4) of this embodiment, the electrodes module 2.4 of the measuring device 1.4 comprises a first sub-assembly and a second sub-assembly of electrodes comprising respectively a first central measuring electrode 200A connected to the (−) input of the integrated circuit 3 and a second central measuring electrode 200B connected to the (+) input of the integrated circuit 3. These two central measuring electrodes 200A, 200B are arranged opposite one to the other, and defining, a space inside which is situated a target electrode 7 of which the displacement is to be measured. The central measuring electrodes 200A, 200B are surrounded respectively by guard electrodes 204A, 204B which are connected to the guard 25 via a first connecting cable 24A and a second connecting cable 24B, respectively.

Figure 5:
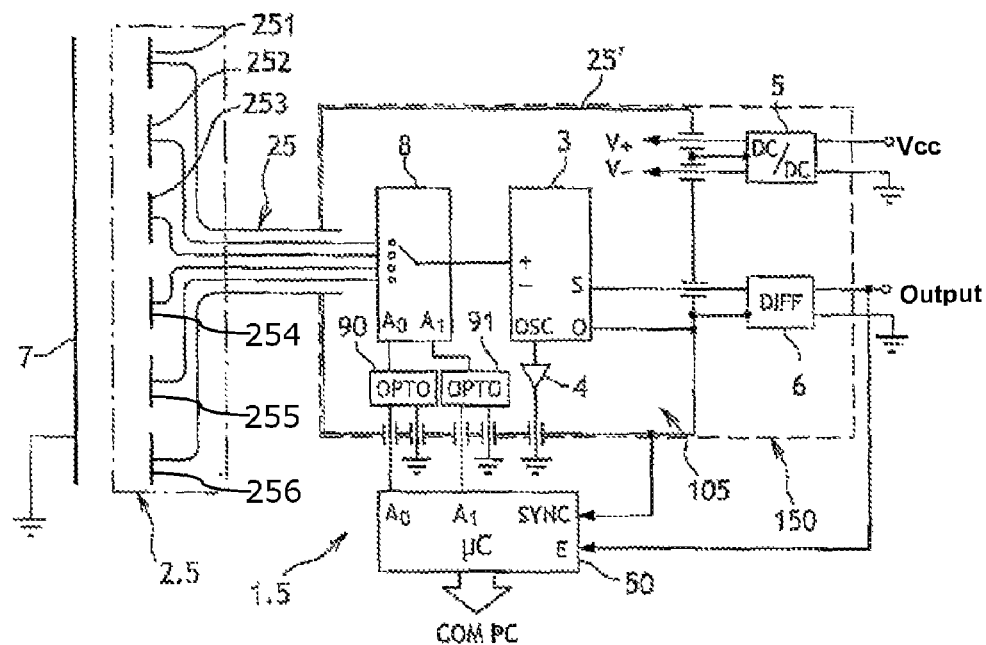
FIG. 5 illustrates a first version of a fourth embodiment of a device for capacitive measurement according to the invention, in a switched multi-electrodes assembly.
Figure 6:
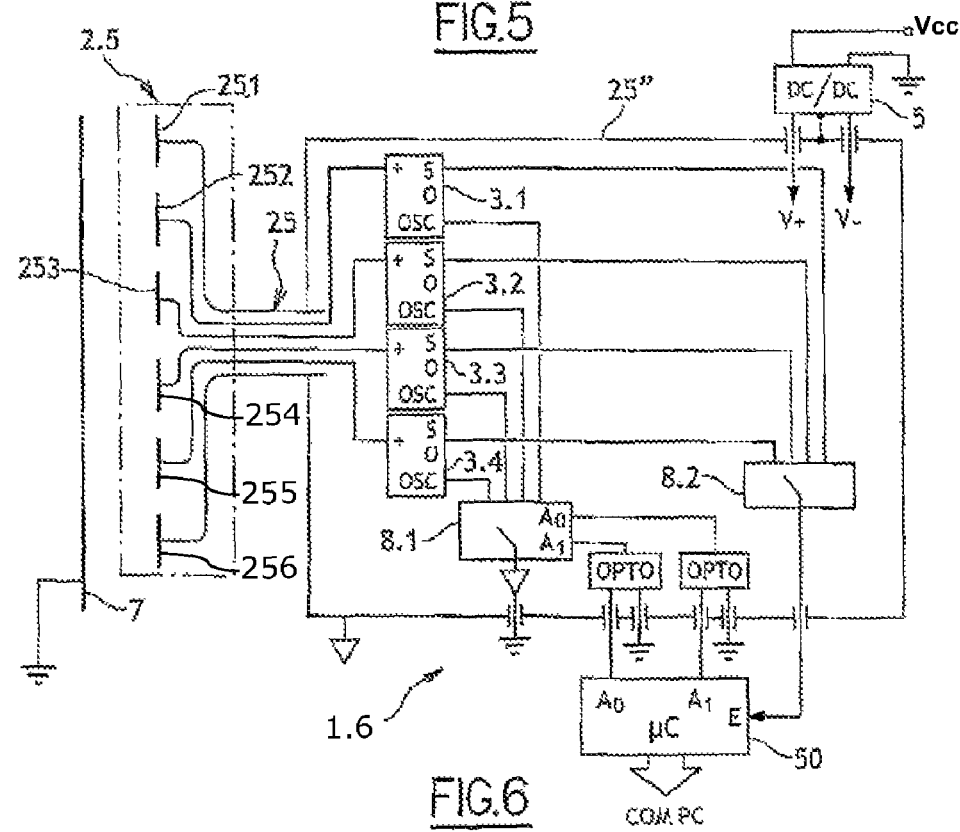
FIG. 6 illustrates a second version of the fourth embodiment, in a multi-electrodes multi-integrated-circuit assembly.

In a fourth embodiment illustrated by FIGS. 5 and 6, the devices for capacitive measurement 1.5, 1.6 are provided with a multi-electrodes module 2.5 comprising four measuring electrodes 252, 253, 254, 255, surrounded by a concentric guard electrode 251, and arranged close to a target electrode 7.

In a first version (FIG. 5), of the "switched multi-electrodes" type, the device for capacitive measurement 1.5 comprises, inside a guard 25', to which the guard electrode 251 is connected via a connecting cable 256, a switching circuit 8 of which the inputs are connected to each of the measuring electrodes 252-255 of the electrodes module 2.5 and of which the output is connected to the (+) input of the integrated circuit for capacitive measurement 3.

The switch 8, which carries out a multiplexing function, is controlled from selection inputs (Ao, A1) connected via optocoupler circuits 90, 91 to two outputs of one microcontroller 50 arranged outside the guard 25'. This microcontroller 50 comprises a synchronization input SYNC connected to the guard 25' and an input E connected to the output of the differential amplifier 6. The microcontroller 50 is connected by a communication bus to an external data terminal.

In a second version (FIG. 6) of the "multi-electrodes, multi-integrated circuits" type, the device for capacitive measurement 1.6 comprises, inside a guard 25", to which the guard electrode 251 is connected, four integrated circuits for capacitive measurement 3.1, 3.2, 3.3, 3.4, of which the respective (+) inputs are connected to the four measuring electrodes 252-255 and of which the oscillator outputs OSC are connected to inputs of a first switch 8.1 of which the output is connected via an amplifier 4 to the general earth of the capacitive device 1.6.

The device for capacitive measurement 1.6 also comprises a second switch 8.2 of which the inputs are connected to the respective outputs S of the four integrated circuits for capacitive measurement 3.1-3.4. The two first and second switches 8.1, 8.2 are controlled via optocouplers 90, 91 by the microcontroller 50 which receives at input the output signal delivered by the second switch 8.2. The microcontroller can be floating and in these conditions the optocouplers are connected at the level of the "COM PC" line.

An embodiment of the direct current/direct current (DC-DC) converter 5 consists of etching coils onto printed circuit with standard industrial methods. At least one coil excited by an alternating signal referenced to the general earth represents a primary circuit of a transformer and at least one receptor coil forming a secondary circuit and generating, after rectifying, filtering and even regulating, a direct-current voltage representing the floating direct-current voltage to supply the floating electronic unit. This embodiment is of the well known "planar transformer" type based on the use of flat coils etched onto multilayer printed circuit, with coils superimposed and often in the form of spirals. This transformer, providing the DC-DC galvanic isolation, can be given with an improved performance by using a ferrite.

Figure 7:
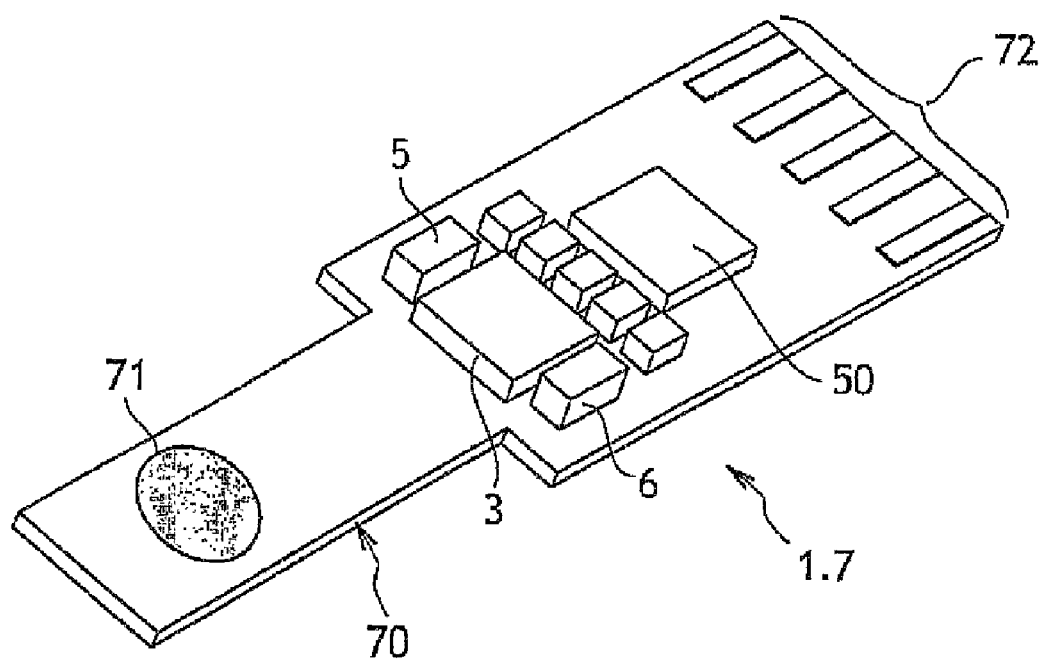
FIG. 7 diagrammatically illustrates an example of a configuration of a displacement sensor implementing a device for capacitive measurement according to the invention.

With reference to FIG. 7, it is technically possible to produce a complete miniature capacitive chain by using a printed circuit on which the measuring electrode is etched, and an integrated circuit for capacitive measurement 3, a floating supply 5, for example with a planar transformer, a connection 72 with the outside, a differential amplifier 6, optocouplers, and a microcontroller 50 are fixed in proximity.

This miniaturization makes it possible to produce high-performance position- or displacement-measuring sensors of which the housing and space requirement are similar to those for standard proximity sensors (capacitive or inductive) which exhibit very mediocre metrological performances.

Another non-limitative application of a device for capacitive measurement according to the invention is to produce a contactless strain gauge with a printed circuit described above. In fact for measuring a geometrical deformation of a mechanical part in order to determine mechanical stress parameters (force, flexion, fatigue, load, etc) laboratories and manufacturers bond strain gauges, onto which are fixed bridges or half-bridges of electrical components, in general resistors, of which the electrical values change with their geometrical deformation. The drawback of this technique is the difficulty of bonding (manual, degrades over time, costly) and the precision is limited, among others, by the quality of the bond ensuring the transfer of mechanical deformation of the object to be tested to the gauge.

A complete sensor according to the invention, mounted on a printed circuit, can be fixed to a reference support, the electrode targeting the surface of the part subjected to the deformation to be measured. By choosing the material constituting the printed circuit such that the assembly formed by the mechanical support of the sensor, printed circuit and the part being deformed are compatible, i.e. with thermal drift coefficients such that the assembly is minimally affected by temperature, it is possible to produce a contactless strain gauge which is therefore without bonding problems, with improved precision, very quick (dynamic measurement), stable over time and miniature.

An application of this type of contactless gauge relates for example to the mechatronics sector, in particular for the measurement of radial or axial load to which a ball bearing is subjected during use. Thus a complete printed circuit sensor can be placed at the level of the bearing and measure the compression of the ball bearing under a radial load by acting on the stiffness of deformable strips. This technique can for example be used to measure the weight of laundry in a washing machine by means of a ball bearing which holds the drum or to measure a load transported by a hoist.

Of course, the invention is not limited to the examples which have just been described, and many modifications can be made to these examples without exceeding the scope of the invention.

The invention claimed is:

1. A device for capacitive measurement by a floating bridge, comprising:
   a sensor module comprising at least one measuring electrode and at least one guard electrode arranged close to a target connected to a general earth,
   a guard to which said guard electrode is connected,
   at least one integrated circuit for capacitive measurement, and comprising (i) a measurement input and (ii) an excitation output for measuring capacitances between electrodes connected respectively to said measurement input and to an excitation signal generated on said excitation output, (iii) an earth terminal and (iv) a measurement output,
   means for supplying said integrated circuit for capacitive measurement in floating mode, and
   wherein said measurement input is connected to said measuring electrode, said guard is connected to the reference earth terminal of said integrated circuit, and said excitation output is connected to said general earth.

2. The device according to claim 1, wherein said means for floating supply are arranged to achieve an electrical isolation of the integrated circuit for capacitive measurement, with regard to the general earth.

3. The device according to claim 1, further comprising means for differential amplification for generating, from the output signal of the integrated circuit for capacitive measurement, an output signal referenced to the general earth.

4. The device according to claim 1, further comprising amplification means arranged between the excitation output of the integrated circuit for capacitive measurement and the general earth.

5. The device according to claim 4, further comprising means for supplying the amplification means at a voltage which can be higher than that of the integrated circuit for capacitive measurement.

6. The device according to claim 1, further comprising a second guard electrode surrounding the first guard electrode), wherein said second guard electrode is connected to the general earth.

7. The device according to claim 1, in which the sensor module comprises a first and a second measuring electrodes, substantially parallel, and between which is situated is a target electrode connected to the general earth, wherein said first and second measuring electrodes, are connected respectively to a first and a second inputs of the integrated circuit for capacitive measurement, and are surrounded respectively by first and second guard electrodes.

8. The device according to claim 7, wherein said first and second guard electrodes are connected to each other and to the guard by means of a common guard connection.

9. The device according to claim 7, wherein said first and second guard electrodes are connected to the guard via a first and a second guard connections, respectively.

10. The device according to claim 1, further including a plurality of measuring electrodes surrounded by a guard electrode connected to the guard.

11. The device according to claim 10, further including switching means connected at input to the plurality of measuring electrodes and at output to an input of the integrated circuit for capacitive measurement, situated at the inside of the guard and controlled by means for controlling and processing.

12. The device according to claim 11, further including optocoupling means arranged between the switching means and the means for control and processing.

13. The device according to claim 10, characterized further including a plurality of integrated circuits for capacitive measurement each connected at input to a measuring electrode and at output, each having their excitation output connected to the input of first switching means, of which the output is connected to the general earth, and their measurement output connected to the input of second switching means generating at output a multiplexed capacitive measurement signal, said first and second switching means being situated inside the guard and controlled by means for control and processing.

14. The device according to claim 1, wherein said integrated circuit for capacitive measurement comprises charge transfer capacitance/digital converter means.

15. The device according to claim 1, wherein said integrated circuit for capacitive measurement comprises a Delta Sigma capacitance-digital converter.

16. The device according to claim 1, wherein said integrated circuit for capacitive measurement is designed to generate digital output signals, characterized in that it also comprises optocoupling means for processing the output signals of the integrated circuit for capacitive measurement.

17. The device according to claim 1, wherein said integrated circuit for capacitive measurement is situated close to the electrodes of the sensor module.

18. The device according to claim 1, wherein said integrated circuit for capacitive measurement is remote from the electrodes by means of a coaxial or triaxial cable.

19. The device according to claim 1, wherein said integrated circuit for capacitive measurement comprises differential inputs and has a single guard.

20. The device according to claim 1, further including means for floating supply for supplying the components arranged inside the guard.

21. The device according to claim 20, wherein said supply means are chosen from the following means: direct current/direct current (DC-DC) conversion means, alternating current/direct current (AC-DC) conversion means, at least one choke coil, at least one electrical cell, at least one battery or any other energy/DC converter.

22. The device according to claim 21, in which the supply means comprise DC-DC or AC-DC conversion means, wherein said DC-DC or AC-DC conversion means comprise a transformer comprising as primary circuit, a coil excited by an alternating signal referenced to a general earth and, as a secondary circuit, a receptor coil connected to rectifier means for generating one or a plurality of floating direct current voltages.

23. The device according to claim 22, wherein the transformer is of the "planar" type.

24. A miniaturized device for capacitive measurement according to claim 1, produced in the form of a printed circuit on which the measuring electrode is etched, said printed circuit receiving the integrated circuit for capacitive measurement, the floating supply means, and the means of connection of the integrated circuit with external equipments.

25. The device according to claim 1, implemented in an anti-collision system.

26. The device according to claim 1, implemented in a shape recognition system.

27. The device according to claim 1, implemented in a strain gauge, wherein it is fixed onto a reference support and has at least one measuring electrode targeting the surface of a part being subjected to a deformation to be measured.

28. The device according to claim 1, implemented in a dimensional metrology system.

29. The device according to claim 1, implemented in a biosensor system.

30. The device according to claim 1, implemented for a characterization of materials.

31. A method for capacitive measurement by floating bridge using a sensor module, comprising steps of:
   arranging at least one measuring electrode and at least one guard electrode close to a target connected to a general earth,
   connecting said guard electrode to a guard,
   providing at least one integrated circuit for capacitive measurement, comprising (i) a measurement input and (ii) an excitation output for measuring capacitances between electrodes connected respectively to said measurement input and to an excitation signal generated on said excitation output, (iii) an earth terminal and (iv) a measurement output,
   supplying said integrated circuit for capacitive measurement in floating mode,
   connecting said measurement input to said measuring electrode,
   connecting said guard to the reference earth terminal of said integrated circuit, and
   connecting said excitation output to said general earth.

32. The method according to claim 31, further comprising a step of differential amplification of the output signal of the integrated circuit for capacitive measurement, for generating an output signal referenced to the general earth.

33. The method according to claim 31, further comprising a step of amplification of the excitation signal generated by the integrated circuit for capacitive measurement.

34. The method according to claim 31, used in a device provided with a plurality of measuring electrodes, further comprising for a step of connecting with a switch a measuring electrode from the plurality of measuring electrodes at the input of the integrated circuit for capacitive measurement.

35. The method according to claim 31, used in a device provided with a plurality of measuring electrodes connected at the input of a plurality of integrated circuits for capacitive measurement, further comprising steps of switching of the excitation outputs of the plurality of integrated circuits for capacitive measurement to the general earth and switching of the measurement outputs of the plurality of integrated circuits for capacitive measurement to a multiplexed output.

* * * * *